(12) United States Patent
Boudreau, Jr. et al.

(10) Patent No.: US 10,401,400 B2
(45) Date of Patent: Sep. 3, 2019

(54) LOAD-SIDE SENSE WITH FLOATING GROUND REFERENCE

(71) Applicant: Landis+Gyr LLC, Lafayette, IN (US)

(72) Inventors: Frank J. Boudreau, Jr., Otterbein, IN (US); Matthew Eric Kraus, Jamestown, IN (US)

(73) Assignee: Landis+Gyr LLC, Lafayette, IN (US)

( * ) Notice: Subject to any disclaimer, the term of this patent is extended or adjusted under 35 U.S.C. 154(b) by 115 days.

(21) Appl. No.: 15/664,928

(22) Filed: Jul. 31, 2017

(65) Prior Publication Data

US 2019/0033352 A1    Jan. 31, 2019

(51) Int. Cl.
*G01R 21/00* (2006.01)

(52) U.S. Cl.
CPC .................................. *G01R 21/00* (2013.01)

(58) Field of Classification Search
CPC ..... G05F 1/66; G05F 1/67; H02J 11/00; H02J 13/0086; H02J 3/16; H02J 3/18; G01D 4/004; G01D 4/02; G01R 19/0092; G01R 21/00; G01R 21/06; G01R 19/16547; G01R 22/00; G01R 35/04; G06F 1/30; G06F 1/26
See application file for complete search history.

(56) References Cited

U.S. PATENT DOCUMENTS

| | | | |
|---|---|---|---|
| 4,096,436 A | 6/1978 | Cook et al. | |
| 4,896,105 A * | 1/1990 | Engel | G01R 21/133 318/696 |
| 5,548,209 A | 8/1996 | Lusignan et al. | |
| 7,772,829 B2 * | 8/2010 | Shuey | G01R 21/133 324/110 |
| 8,432,655 B2 * | 4/2013 | Voisine | G01R 11/17 361/65 |
| 8,823,359 B2 | 9/2014 | Zhang et al. | |
| 2012/0078546 A1 * | 3/2012 | Mancuso | G01R 19/155 702/61 |
| 2016/0187393 A1 * | 6/2016 | Ramirez | G01R 19/155 324/126 |

* cited by examiner

*Primary Examiner* — Vinh P Nguyen
(74) *Attorney, Agent, or Firm* — Kilpatrick Townsend & Stockton LLP (57) ABSTRACT

An electricity meter includes a disconnect switch connected to a service transformer, a line-side sense circuit, a load-side sense circuit, and a measurement and control circuit. The disconnect switch is configured to receive a phase voltage and an anti-phase voltage from the service transformer. The line-side sense circuit includes a first sense circuit configured to detect the phase voltage delivered to the electricity meter and a second sense circuit configured to detect the anti-phase voltage delivered to the electricity meter, the first sense circuit and the second sense circuit are each connected to a floating reference node. The load-side sense circuit is configured to detect the existence of a phase load and an anti-phase load at a service entrance. The measurement and control circuit is configured to receive a phase output voltage and an anti-phase output voltage from the line-side sense circuit and further configured to receive a phase load output voltage and anti-phase load output voltage from the load-side sense circuitry.

18 Claims, 11 Drawing Sheets

LOAD-SIDE SENSE WITH FLOATING GROUND REFERENCE

FIELD

This document relates to the field of electricity meters, and particularly to the reference voltages for various circuits in electricity meters.

BACKGROUND

Electrical service providers such as electrical utilities employ electricity meters to monitor energy consumption by customers (or other entities). Electricity meters track the amount of energy consumed by a load (e.g. the customer), typically measured in kilowatt-hours ("kwh"), at each customer's facility. The service provider uses the consumption information primarily for billing, but also for resource allocation planning and other purposes.

Electrical power is transmitted and delivered to load/customer in many forms. For example, electrical power may be delivered as polyphase wye-connected or delta-connected power or as single phase power. Such various forms are known as service types. Different standard electricity meter types, known as meter forms, are used to measure the power consumption for the various service types. The commonly used meter forms in the United States include those designated as 2S, 3S, 5S, 45S, 6S, 36S, 9S, 16S, 12S and 25S meter forms, which are well known in the art.

Figure 5:
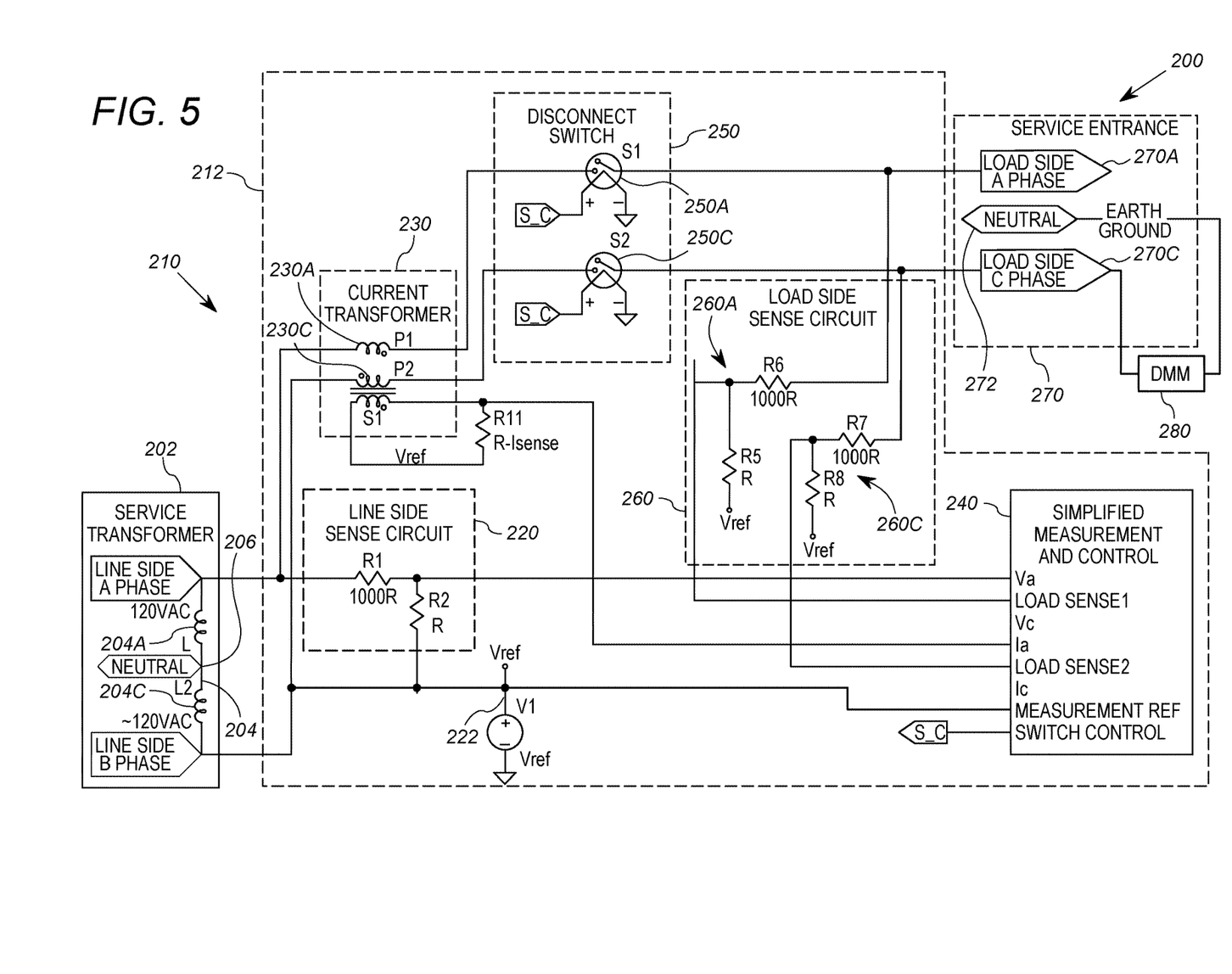
FIG. 5 shows a meter having a line-side phase C reference.

FIG. 5 shows an exemplary split phase residential electrical service including a service transformer 202, an electricity meter 210, and a service entrance 270. The service transformer 202 includes a single-phase primary winding (not shown) and a center-tapped secondary winding 204. The secondary winding 204 includes a phase A portion 204A, a phase C portion 204C, and a neutral center tap 206 (which is connected to earth ground). The line-to-line voltage provided across the secondary winding 204 is typically 240V. The neutral center tap 206 on the secondary winding 204 results in a split of the 240V line-to-line voltage into a first line voltage of 120V (i.e., the line-side phase A voltage) and a second line voltage of 120V (i.e., the line-side phase C voltage), with the line-side phase A voltage 180° out of phase with the line-side phase C voltage (which line-side phase A and line-side phase C voltages may also be referred to herein as "phase A" and "phase C" voltages, "A phase" and "C phase" voltages, or alternatively, the "phase" and "anti-phase" voltages). With this arrangement, certain outlets within a residence may be configured to provide a lower voltage and other outlets within the residence may be configured to provide a higher voltage. For example, certain outlets may be configured to provide 120V for lighting and small appliances (i.e., these outlets connected between the phase A and neutral or phase C and neutral). Other outlets may be configured to provide 240V for large appliances (i.e., these outlets are connected across the two line conductors, thus providing the full line-to-line voltage). Because of the ground connection at the center tap 106 of the secondary winding, the circuits provided by the service transformer 202 are typically well balanced within a volt or two. Therefore, if a digital multi-meter is used to measure between neutral and phase A and phase C, both measurements will be close to 120V and 180 degrees out of phase.

The phase A and phase C voltages from the service transformer 202 are delivered to an electricity meter 210 before being passed on to the service entrance 270. The electricity meter 210 includes a number of circuits including a line-side sense circuit 220, a current transformer circuit 230, a measurement and control circuit 240, a disconnect switch circuit 250, and a load-side sense circuit 260. Each of these circuits may be provided with solid-state components or integrated circuits, as will be recognized by those of skill in the art.

The line-side sense circuit 220 is used to measure the line voltage (e.g., the phase A line voltage) delivered to the meter 210. The line-side sense circuit 220 includes two resistors, R1 and R2, which act as a voltage divider (. The value of resistor R1 is significantly greater than that of R2. In particular, in FIG. 5, the value of R1 is about 1000 times greater than that of R2. Accordingly, the output of the voltage divider is a small fraction of the actual phase A line voltage. The output of the voltage divider is fed to the "$V_A$" input of the measurement and control circuit 240. The reference voltage for the voltage divider is provided at node 222, which is the phase C voltage. Accordingly, the meter 210 uses the phase C voltage as a hard reference for the voltage measurement.

The current transformer circuit 230 is used to measure the current (e.g., the phase A and/or phase C current) delivered to the meter 210. The current transformer circuit 230 includes a phase A current transformer 230A and a phase C current transformer 230C. The phase A current transformer includes a phase A conductor P1 and a secondary winding Si. The phase A conductor P1 is connected to the line-side phase A service transformer 204A, and the secondary winding Si is connected to the $I_a$ input on the measurement and control circuit 240. Accordingly, the measurement and control circuit 240 is provided with an indication of the phase A current at the $I_a$ input. Similarly, the phase C conductor P2 is connected to the line-side phase C service transformer 204C. Although not shown in FIG. 5, in at least one embodiment a secondary winding associated with the phase C conductor P2 is connected to the $I_C$ input on the measurement and control circuit 240. Accordingly, the measurement and control circuit 240 is further provided with an indication of the phase C current at the $I_C$ input.

The disconnect switch circuit 250 is used to disconnect the phase A and phase C voltages from the service entrance. The disconnect switch circuit 250 includes a phase A disconnect switch 250A and a phase C disconnect switch 250C. The phase A disconnect switch 250A is connected to the phase A conductor P1 and the phase C disconnect switch 250C is connected to the phase C conductor P2. The phase A disconnect switch 250A and the phase C disconnect switch 250 C are each controlled by the switch control output SC of the measurement and control circuit 240. The outputs of the phase A disconnect switch 250A and the phase C disconnect switch 250C lead to the service entrance 270. In particular, the output of the phase A disconnect switch 250A leads to the load-side phase A service entrance 270A, and the output of the phase C disconnect switch 250C leads to the load-side phase C service entrance 270C. When the phase A disconnect switch 250A and the phase C disconnect switch 250C are both open, no electrical power is provided to the customer at the service entrance 270.

The load-side sense circuit 260 is configured to detect the existence or non-existence of a customer load. The load-side sense circuit 260 includes a phase A resistive network 260A and a phase C resistive network 260C. The phase A resistive network 260A includes two resistors arranged as a voltage divider, including resistors R5 and R6. The reference voltage for the voltage divider of the phase A resistive network 260A is the Vref voltage provided at node 222, which is the phase C line voltage in the embodiment of FIG. 5. As shown in FIG. 5, the value of resistor R5 is similar to that of resistor R2, and the value of resistor R6 is significantly greater than the value of resistor R5. In particular, the value of resistor R6 is about 1000 times greater than the value of resistor R5. Accordingly, the output of the voltage divider is a small fraction of the actual phase A load voltage. The output of the phase A resistive network 260A (i.e., a phase load output voltage) is connected to the "LOAD_SENSE 1" input of the measurement and control circuit 240. Accordingly, the measurement and control circuit 240 is configured to measure an existing load associated with the phase A service entrance 270A.

The phase C resistive network 260C is similar to the phase A resistive network, and includes resistors R7 and R8, with an output (i.e., an anti-phase load output voltage) that is connected to the "LOAD_SENSE2" input of the measurement and control circuit 240 (resistor R7 in the phase C resistive network provides the output impedance and may also be referred to herein as the output load resistor of the voltage divider). Accordingly, using the phase C resistive network 260C, the measurement and control circuit 240 is configured to measure an existing load associated with the phase C service entrance 270C.

As noted previously, the meter 210 uses the phase C voltage as a hard reference for the measurement of other voltages (i.e., note that the phase C voltage is delivered to the measurement and control circuit as the "Measurement Ref" input). However, as explained in further detail below, even if no load is present at the service entrance, this arrangement may result in a phantom voltage being detected at the service entrance, and therefore prevent the service disconnect switch from being closed.

With continued reference to FIG. 5, consider a situation wherein the disconnect switch 250 is open, and no load is present at the service entrance 270 on the customer side of the meter 210 (e.g. the main service breaker is open or there are no electrical appliances, devices, lights, etc. of any kind installed). In this situation with no customer load and the service switches 250A and 250C open, the meter technician may use a DMM to measure a the following:

Load-side Meter A Phase to Neutral: 110 to 115 Vrms;
Load-side Meter C Phase to Neutral: 110 to 115 Vrms; and
Load-side Meter A Phase to Load-side Meter C phase: 0 Vrms.

These measurements assume 240 Vrms provided on the primary winding of the service transformer 202, and a digital multi-meter (DMM) input impedance of 10 M ohms. In this case, the neutral bypasses the meter and ties the customer service directly to the service transformer 202. Consequently, the neutral is unavailable for measurement purposes, and all voltage measurements are referenced to one line of the service (i.e., the C-phase line voltage in FIG. 5).

As shown in FIG. 5 in order to make the measurement of the Load-side Meter C phase to Neutral, the technician connects a DMM 280 between the Load-side C Phase and the neutral 272 at the service entrance 270. However, in the absence of a customer side load, when the DMM 280 is placed across the Load-side Phase C service entrance 270C and the neutral 272, a circuit is completed which resulting in a phantom Voltage being displayed on the DMM. In other words, as shown in FIG. 5, if a DMM 280 is connected between the Load-side C Phase 270C and the neutral 272 at the service entrance 270, a complete circuit is formed that extends from earth ground at neutral 272, across the DMM 280, across the Load-side C Phase service entrance 270C, across R6 and R7 of the resistive network 260C of the load-side sense circuit 260, across the reference voltage ($V_{ref}$) and the phase C portion 204C of the service transformer 202, and returning to earth ground at neutral center tap 206. Because of this completed circuit, the DMM 280 will register a voltage measurement, which appears to the utility as a load resistance, although this is actually a phantom load since no load is actually present at the service entrance 270. The phantom voltage may be around 110 to 115 Vrms due to the voltage divider formed by the input impedance of the DMM (e.g., 10 M ohms) and output impedance of the load-side sense circuitry 260 when no customer load is present. While the DMM 280 only detects a small current flow in this arrangement, this small current flow is sufficient to indicate the existence of some load at the service entrance.

In the event the disconnect switches 250A and 250C are open, and a load is detected at the service entrance 270, the detected load will prevent the disconnect switches 250A and 250C from being closed (whether by the technician or other means). This is true even if the load is a phantom load, as described above. In particular, even though it would be safe to close the service disconnect switch with a phantom load (since no actual load is present), it may not be safe to close the service disconnect switch with a real load condition (which may indicate co-generation by the customer or another third party tampering condition). Unfortunately, a phantom load cannot be differentiated from a real load condition based simply on readings from the measurement and control circuit 240 in a traditional utility meter. Accordingly, in these situations, the utility must investigate the actual conditions of the detected load (whether phantom or real) prior to closing the service disconnect switch.

In view of the foregoing, it would be advantageous to provide an arrangement for an electricity meter that avoids the detection of a phantom load when no load is actually present on the customer side of the meter at the service entrance. It would be further advantageous if such arrangement for an electricity meter could predict the existence of any unsafe conditions at the service entrance prior to closure of the disconnect switches 250A and 250C.

SUMMARY

In accordance with one exemplary embodiment of the disclosure, an electricity meter includes a disconnect switch connected to a service transformer, a line-side sense circuit, a load-side sense circuit, and a measurement and control circuit. The disconnect switch is configured to receive a phase voltage and an anti-phase voltage from the service transformer. The line-side sense circuit includes a first sense circuit configured to detect the phase voltage delivered to the electricity meter and a second sense circuit configured to detect the anti-phase voltage delivered to the electricity meter, the first sense circuit and the second sense circuit are each connected to a floating reference node. The load-side sense circuit is configured to detect the existence of a phase load and an anti-phase load at a service entrance. The measurement and control circuit is configured to receive a phase output voltage and an anti-phase output voltage from the line-side sense circuit and further configured to receive a phase load output voltage and anti-phase load output voltage from the load-side sense circuitry.

In accordance with another exemplary embodiment of the disclosure, an electricity meter comprises a disconnect switch connected to a service transformer, a line-side sense circuit, a load circuit, and a control circuit. The line-side sense circuit is connected to a floating reference node. The line-side sense circuit is configured to detect a voltage delivered to the electricity meter. A load-side sense circuit is configured to detect the existence of a load at a service entrance. A control circuit is configured to receive an output from the line-side sense circuit and an output from the load-side sense circuit, the control circuit further configured to deliver an output signal to the floating reference node.

Pursuant to yet another exemplary embodiment of the disclosure, a method is provided for detecting a customer load arrangement. The method includes obtaining readings from a measurement and control circuit of an electricity meter with a disconnect switch of the electricity meter opened, the electricity meter including a line-side sense circuit connected to a floating reference node and a load-side sense circuit connected to the floating reference node. The method further includes analyzing the readings from the line-side sense circuit and the load-side sense circuit. Additionally, the method includes determining whether the customer load arrangement is one of a cogeneration arrangement or borrowed power arrangement. When it is determined that the customer load arrangement is one of the cogeneration arrangement or borrowed power arrangement, the method further includes identifying the customer load arrangement as either a cogeneration arrangement or a borrowed power arrangement.

The above described features and advantages, as well as others, will become more readily apparent to those of ordinary skill in the art by reference to the following detailed description and accompanying drawings. While it would be desirable to provide an electricity meter that provides one or more of these or other advantageous features, the teachings disclosed herein extend to those embodiments which fall within the scope of the appended claims, regardless of whether they accomplish one or more of the above-mentioned advantages.

DESCRIPTION

Exemplary Meter With Floating Ground Reference

Figure 1:
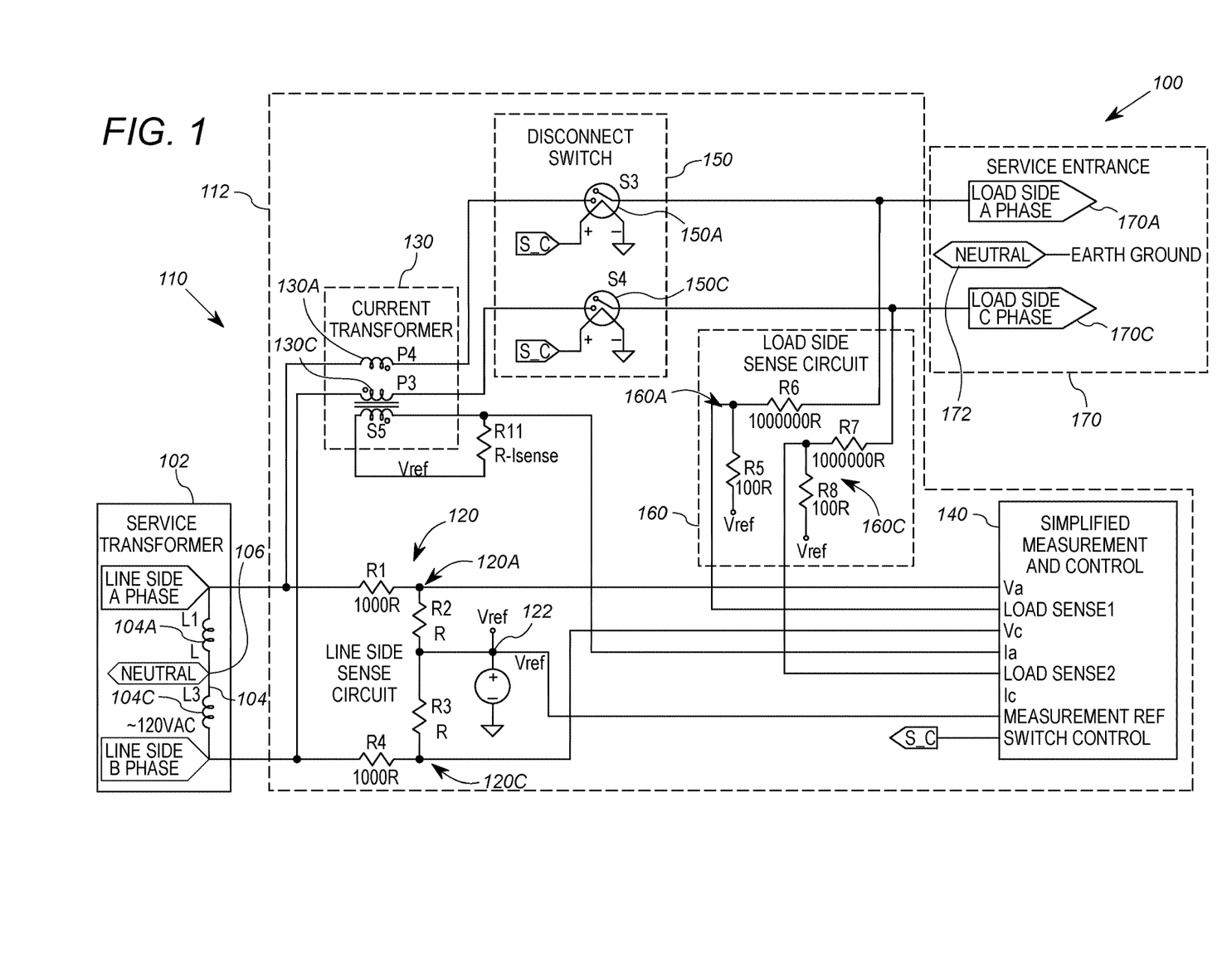
FIG. 1 shows a circuit diagram of an exemplary meter having a load-side sense with floating ground reference.

Referring now to the drawings, and more particularly to FIG. 1, a diagram of an exemplary electrical utility meter 110 with a floating ground reference is shown in use with a split phase electrical service arrangement 100. In FIG. 1, the meter 110 is operably coupled to utility power lines via a service transformer 102. The utility power lines are connected to a source of electricity, such as a power transmission and distribution system (not shown). A load (typically a consumer of electrical power) is connected to the power lines through the meter 110. The meter 110 is configured to detect the amount of electricity delivered to the load. The meter 110 is operable to, among other things, generate metering information representative of a quantity of electrical energy delivered to the load. A housing 212 encases various circuits and other components of the meter. The various circuits are secured within the housing assembly 212 and are operable to receive voltage and current signals related to the power provided to the load, generate measurement signals therefrom, and connect or disconnect a customer load from the meter and the associated power lines.

The exemplary meter 110 of FIG. 1 is a split phase residential electrical service including a service transformer 102, an electricity meter 110, and a service entrance 170 that connects the customer load to the utility power lines. The service transformer 102 includes a single-phase primary winding (not shown) and a center-tapped secondary winding 104. The secondary winding 104 includes an A phase portion 104A, a C phase portion 104C, and a neutral center tap 106 (which is connected to earth ground). The neutral center tap 106 on the secondary winding 204 results in a split of the 240V line-to-line voltage into a first line voltage of 120V (i.e., the line-side A phase voltage) and a second line voltage of 120V (i.e., the line-side C phase voltage), with the line-side A phase voltage 180° out of phase with the line-side C phase voltage (which line-side A phase A and line-side C phase voltages may also be referred to herein as "phase A" and "phase C" voltages, "A phase" and "C phase" voltages, or alternatively, the "phase" and "anti-phase" voltages).

The phase A and phase C voltages are delivered to the electricity meter 110 before being passed on to the customer at the service entrance 170. The electricity meter 110 includes a number of different circuits including a line-side sense circuit 120, a current transformer circuit 130, a measurement and control circuit 140, a disconnect switch circuit 150, and load-side sense circuit 160. Each of these circuits may be provided with solid-state components or integrated circuits, as will be recognized by those of skill in the art.

The line-side sense circuit 120 is used to measure both the A phase line voltage and the C phase line voltage. The line-side sense circuit 120 includes four resistors, R1-R4. Resistors R1 and R2 act as a first voltage divider 120A (with an output representative of the A phase line voltage. The value of resistor R1 is significantly greater than that of R2 (and again, resistor R1 may also be referred to herein as the output line resistor of the voltage divider). In particular, in FIG. 1, the value of R1 is about 1000 times greater than that of R2. Accordingly, the output of the first voltage divider is a small fraction of the actual A phase line voltage. The output of the voltage divider is fed to the "$V_A$" input of the measurement and control circuit 140. Similarly, Resistors R3 and R4 act as a second voltage divider 120C with an output representative of the C phase line voltage (resistor R4 may also be referred to herein as the output line resistor of the voltage divider). The value of resistor R4 is significantly greater than that of resistor R3. In particular, in FIG. 1, the value of resistor R4 is about 1000 times greater than that of resistor R3. Accordingly, the output of the second voltage divider is a small fraction of the actual C phase line voltage.

The output of the voltage divider is fed to the "$V_C$" input of the measurement and control circuit 140.

The measurement reference node 122 for the meter 110 floats at a point between the first voltage divider (provided by R1 and R2) and the second voltage divider (provided by R3 and R4). In other words, the meter 110 has a floating reference at node 122, as this node 122 floats relative to the actual line-to-line service, but approximates the value of the service neutral 106 (i.e., which is tied to earth ground). The measurement reference node 122 (which may also be referred to herein as "floating ground 122") is connected to the "Measurement Ref" output of the measurement and control circuit 140. Load variation that may have an effect on the value of the floating ground 122 but this can be compensated for using firmware in the meter, and particularly firmware in the measurement and control circuit 140. The desired value is typically a value that simulates or estimate what the neutral reference would be in a balanced system. The need to control the value of the floating ground 122 is typically more needed in a system wherein the impedance of the load side sense circuit 160 is approximately the same as the line side sense circuit 120. As explained in further detail below, the meter 110 with the floating ground 122 of FIG. 1 is not subject to phantom voltage readings at the service entrance that would have an effect on the opening or closing of the disconnect switches 150A, 150C.

With continued reference to FIG. 1, the current transformer circuit 130 is used to measure the current (e.g., the A phase and/or C phase current) delivered to the meter 110. The current transformer circuit 130 includes an A phase current transformer winding 130A and a C phase current transformer winding 130C. The A phase current transformer winding 130A includes an A phase conductor P4 and a secondary winding S5. The A phase conductor P4 is connected to the line-side A phase service transformer 104A, and the secondary winding S5 is connected to the Ia input on the measurement and control circuit 140. Accordingly, the measurement and control circuit 140 is provided with an indication of the A phase current at the Ia input. Similarly, the C phase conductor P3 is connected to the line-side C phase service transformer winding 104C. Although not shown in FIG. 1, in at least one embodiment a secondary winding associated with the C phase conductor P3 is connected to the $I_C$ input on the measurement and control circuit 140. Accordingly, the measurement and control circuit 140 is further provided with an indication of the C phase current at the $I_C$ input.

The disconnect switch circuit 150 is used to disconnect the A phase and C phase voltages from the service entrance. The disconnect switch circuit 150 includes an A phase disconnect switch 150A (including switch component S3) and a C phase disconnect switch 150C (including switch component S4). The A phase disconnect switch 150A is connected to the A phase conductor P4, and the C phase disconnect switch 150C is connected to the C phase conductor P3. The A phase disconnect switch 150A and the C phase disconnect switch 150 C are each controlled by the switch control output "SC" of the measurement and control circuit 140. The outputs of the A phase disconnect switch 150A and the C phase disconnect switch 150C lead to the service entrance 170. In particular, the output of the A phase disconnect switch 150A leads to the load-side A phase service entrance 170A, and the output of the C phase disconnect switch 150C leads to the load-side C phase service entrance 170C. When the A phase disconnect switch 150A and the C phase disconnect switch 150C are both open, no electrical power is provided to the customer at the service entrance 170.

The load-side sense circuit 160 is configured to detect the existence or non-existence of a customer load. The load-side sense circuit 160 includes an A phase resistive network 160A and a C phase resistive network 160C. The A phase resistive network 160A includes two resistors arranged as a voltage divider, including resistors R5 and R6 (resistor R6 in the phase A resistive network provides the output impedance and may also be referred to herein as the output load resistor of the voltage divider). The reference voltage for the voltage divider is the Vref voltage provided at node 122, which is the floating ground. As shown in FIG. 1, the value of resistor R6 is significantly greater than the value of resistor R5 (and the value of resistor R5 is significantly greater than the value of resistor R2). In particular, in the disclosed embodiment the value of resistor R6 is about one thousand (1000) times greater than the value of resistor R5 (and the value of resistor R5 is about one hundred (100) times greater than the value of resistor R2). With these large resistor values in the load-side sense circuit, the output of the voltage divider is a very small fraction of the actual A phase load voltage. The output of the voltage divider is fed to the "LOAD_SENSE1" input of the measurement and control circuit 140. Accordingly, the measurement and control circuit 140 is configured to measure an existing load associated with the phase A service entrance 170A.

The C phase resistive network 160C is similar to the A phase resistive network, and includes resistors R7 and R8, with R7 being significantly greater in value than R8. In the disclosed embodiment, the value of resistor R7 is about one thousand (1000) times greater than the value of resistor R8 (and the value of resistor R8 is about one hundred (100) times greater than the value of R3). A reference voltage for the voltage divider provided by the Vref voltage at node 122, which is the floating ground. An output of the C phase resistive network 160C leads to the "LOAD_SENSE2" input of the measurement and control circuit 140. Accordingly, the measurement and control circuit 140 is configured to measure an existing load associated with the C phase service entrance 170C.

Various distinctions can be seen between the electrical service of FIG. 1 and the electrical service of FIG. 5. First, unlike FIG. 5, in the embodiment of FIG. 1, the impedance of the load-side sense circuitry 160 is much greater than the impedance of the line-side sense circuit 120 (i.e., the impedance of the resistive network provided by resistors R5-R8 is much greater than the impedance of the resistive network provided by resistors R1-R4). However, in at least one alternative embodiment, the impedance of the resistive networks may be similar, and load variation can be compensated for using analytics performed by firmware in the meter. In other embodiments, the analytics may be performed by software located within the meter, at the head end of the system, or any of various locations in-between, such as software located remote from the meter in an automatic meter reader (AMR) device or in any of various other devices.

Another distinction between the electrical service of FIG. 1 and that of FIG. 5 is that the measurement reference in FIG. 1 is provided by the floating ground (at node 122). This is in contrast to the circuit arrangement of FIG. 5 where the C phase is used as the measurement reference (at node 222). With node 122 of FIG. 1, a virtual neutral is created that is very close in value to the actual ground/neutral. The virtual neutral tracks the actual ground/neutral and, as a result, the meter 110 is not subject to the phantom voltage issues described previously in association with the service arrangement of FIG. 5. Furthermore, as explained in further detail below, the meter 110 of FIG. 1 is also capable of detecting a number of tamper scenarios and other unsafe load-side voltage scenarios. Detection of these scenarios may be used to greatly improve the reliability and safety of the meter 110 while reducing nuisance load-side voltage alarms that could prevent the meter service switch from closing.

Detection of Load Conditions Using Meter with Floating Reference

Figure 2A:
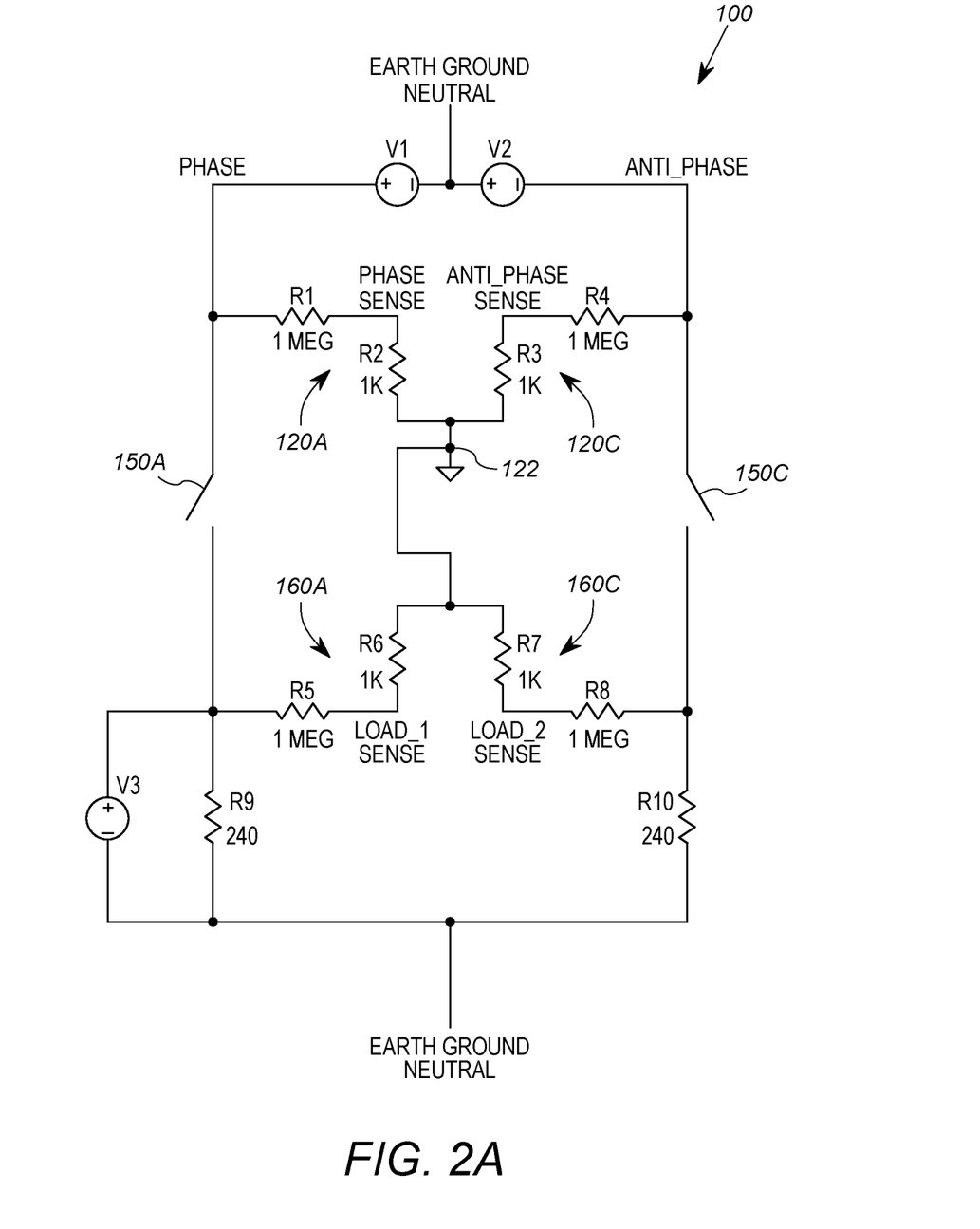
FIG. 2A shows a circuit diagram of an embodiment of the meter of FIG. 1 connected to a first load arrangement.

With reference now to FIGS. 2A-2G, a simplified schematic of the meter 110 with floating ground reference of FIG. 1 is shown with a number of different customer load arrangements (referred to herein as a "load arrangement"). For each load arrangement, the service disconnect switch 150 is open. FIG. 2A illustrates the service disconnect switch 150 in an open position, but the open service disconnect switch is removed in each of FIGS. 2B-2G for the sake of simplicity of the disclosed circuit. Additionally, the current transformer circuit 130 and the measurement and control circuit 140 of FIG. 1 has been removed in each of FIGS. 2A-2G for the sake of simplicity. As will be explained in further detail below, in each of the load connection arrangements represented in FIGS. 2A-2G, the inputs to the measurement and control circuit 140 may be analyzed to determine whether a tamper scenario or other unsafe load arrangement exists. When a tamper or other unsafe load arrangement does exist, the measurement and control circuit 140 will prevent closing of the service disconnect switch 150 until the condition is resolved.

The service transformer in each of FIGS. 2A-2G is shown by voltage sources V1 and V2, which represent the secondary winding 104 of the service transformer 102 of FIG. 1. Voltage source V1 represents the line-side A phase, and voltage source V2 represents the line-side C phase.

The line-side sense circuit 120 in each of FIGS. 2A-2G includes resistors R1-R4. Resistors R1 and R2 provide the A phase line-side sense circuit 120A, and resistors R3 and R4 provide the C phase line-side sense circuit 120C. As discussed previously, the values of resistors R1 and R4 are significantly greater than the values of resistors R2 and R3. Resistors R2 and R3 are tied to the floating ground provided at node 122.

The load-side sense circuit 160 in each of FIGS. 2A-2G includes resistors R5-R8. Resistors R5 and R6 provide the A phase load-side sense circuit 160A, and resistors R7 and R8 provide the C phase load-side sense circuit 160C. As discussed previously, the values of resistors R6 and R7 are significantly greater than the values of resistors R5 and R8. Resistors R5 and R8 are tied to the floating ground provided at node 122.

It should also be noted that in each of FIGS. 2A-2G, the impedance of the load-side and line-side resistive networks are similar, and load variation is compensated for using firmware in the meter. It has been observed that the magnitude of the compensation by the firmware in the meter is inversely proportional to the ratio of the impedance of the line-side sense circuit 120 to the impedance of the load-side sense circuit 160. The compensation performed by the firmware is a mathematical correction that may be applied in using any of various means, such as a sample-by-sample basis. However, in alternative embodiments, the impedance of the load-side resistive network may be much greater than the line-side resistive network, thus reducing the need for adjustment of the floating ground reference using the firmware in the meter. Accordingly, in at least some embodiments, the impedance of the load-side sense circuit 160 is much greater than the impedance of the line-side sense circuit 120. In such embodiment, the values of resistors R6 and R7 are significantly greater than the values of resistors R1 and R4 (e.g., ten times to a thousand times or more greater, and particularly about one thousand times greater in the disclosed embodiment). With such an arrangement, the influence of the load sense resistors is greatly reduced, and the floating node 122 is inherently immune the phantom loading problem seen with other meter arrangements, as discussed previously in association with FIG. 5.

In each of FIGS. 2A-2G, resistor R9, if present, represents a customer A phase load, and resistor R10, if present, represents a customer C phase load. A customer generator is represented by a voltage source V3 and/or V4. Also, if a stolen or borrowed power situation is present (which may be referred to herein as simply a "borrowed power arrangement"), a circuit branch is shown extending between the A phase line voltage and the C phase load (or vice-versa)(e.g., see FIG. 2G). As explained in further detail below, using software analysis of the signals delivered to the measurement and control circuit 140, it is possible to determine whether a co-generation situation exists (both phase locked and non-phase locked) and/or whether a stolen or borrowed power situation, and to discriminate between the two.

FIG. 2A shows a load arrangement wherein both branches of the service are loaded (i.e., both A phase and C phase, as represented by resistors R9 and R10 in FIG. 2A), and a customer generator is connected at the service (as represented by voltage source V3 in FIG. 2A). In this arrangement, the customer generator is a non phase-locked loop (PLL) generator connected to the A phase branch of the load. Using the meter of FIG. 1, the utility is able to determine that this arrangement exists. In particular, the utility will see the following readings on the measurement and control circuit 140: (1) a load-side voltage is detected on the phase A branch at the "LOAD_SENSE1" input; (2) a frequency mismatch occurs between the generator and the line which shows up as a voltage on the "LOAD_SENSE2" input; (3) the generator causes a beat frequency due to the frequency mismatch of the generator and service measured at the line sense input ("Va" or "Vc"). The unbalanced load causes the floating reference to shift. Based on this arrangement, the utility will not close the service disconnect switch 150 until the generator is removed from the load.

Figure 2B:
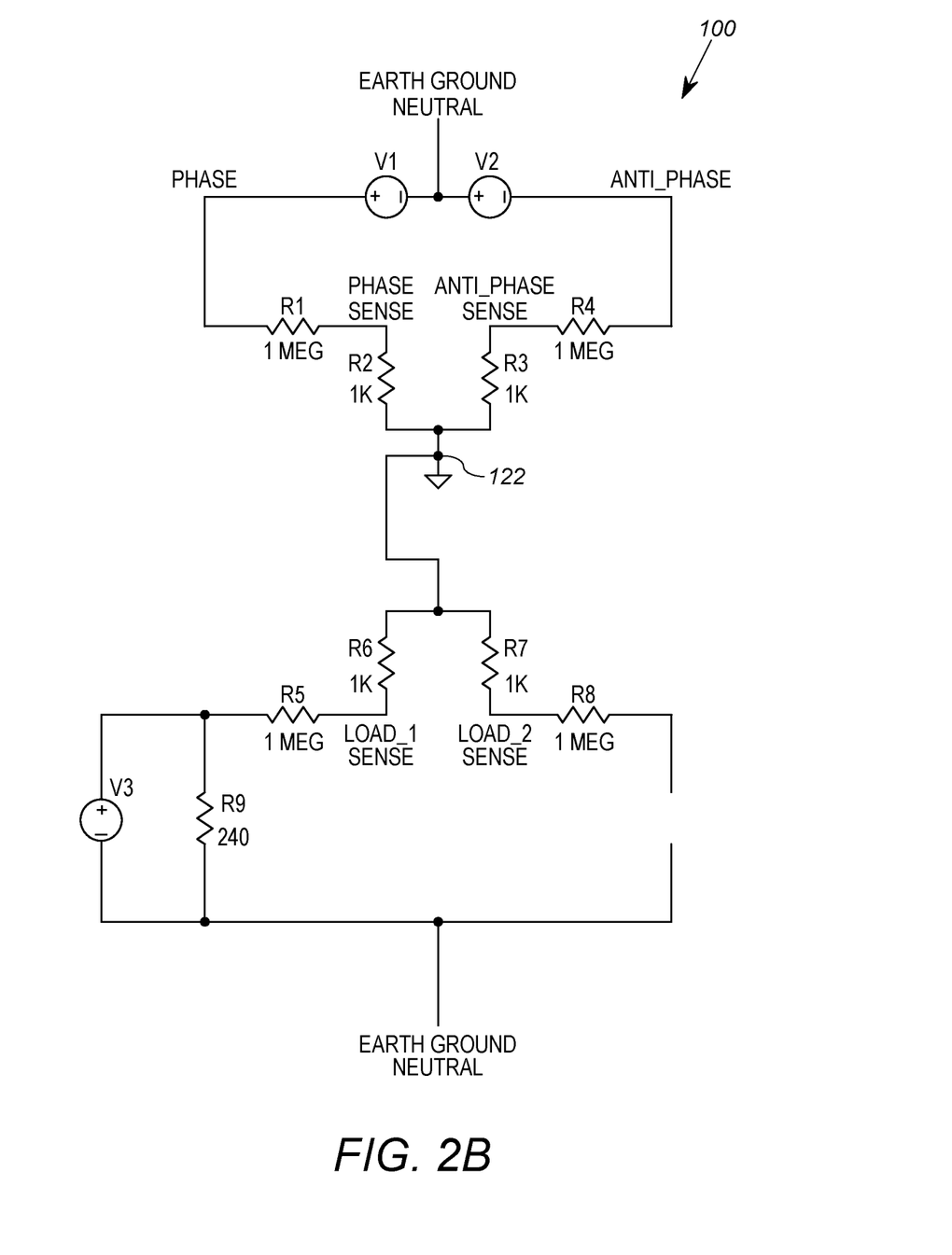
FIG. 2B shows a circuit diagram of an embodiment of the meter of FIG. 1 connected to a second load arrangement.

FIG. 2B shows a load arrangement wherein only one branch of the service is loaded (i.e., the A phase, as represented by resistor R9), and a customer generator is connected at the service (as represented by voltage source V3 in FIG. 2B). In this arrangement, the customer generator is a non phase-locked loop (PLL) generator connected to the A phase branch of the load. Using the meter of FIG. 1, the utility is able to determine that this arrangement exists. In particular, the utility will see the following readings on the measurement and control circuit 140: (1) a load-side voltage is detected on the phase A branch at the "LOAD_SENSE1" input; (2) a frequency mismatch occurs between the generator and the line which shows up as a voltage on the "LOAD_SENSE2" input; (3) the generator causes a beat frequency due to the frequency mismatch of the generator and service measured at the line sense input ("Va" or "Vc"). The unbalanced load causes the floating reference to shift. Based on this arrangement, the utility will not close the service disconnect switch 150 until the generator is removed from the load. The utility may contact the customer in this situation and simply request removal of the generator prior to reconnection of electrical service.

Figure 2C:
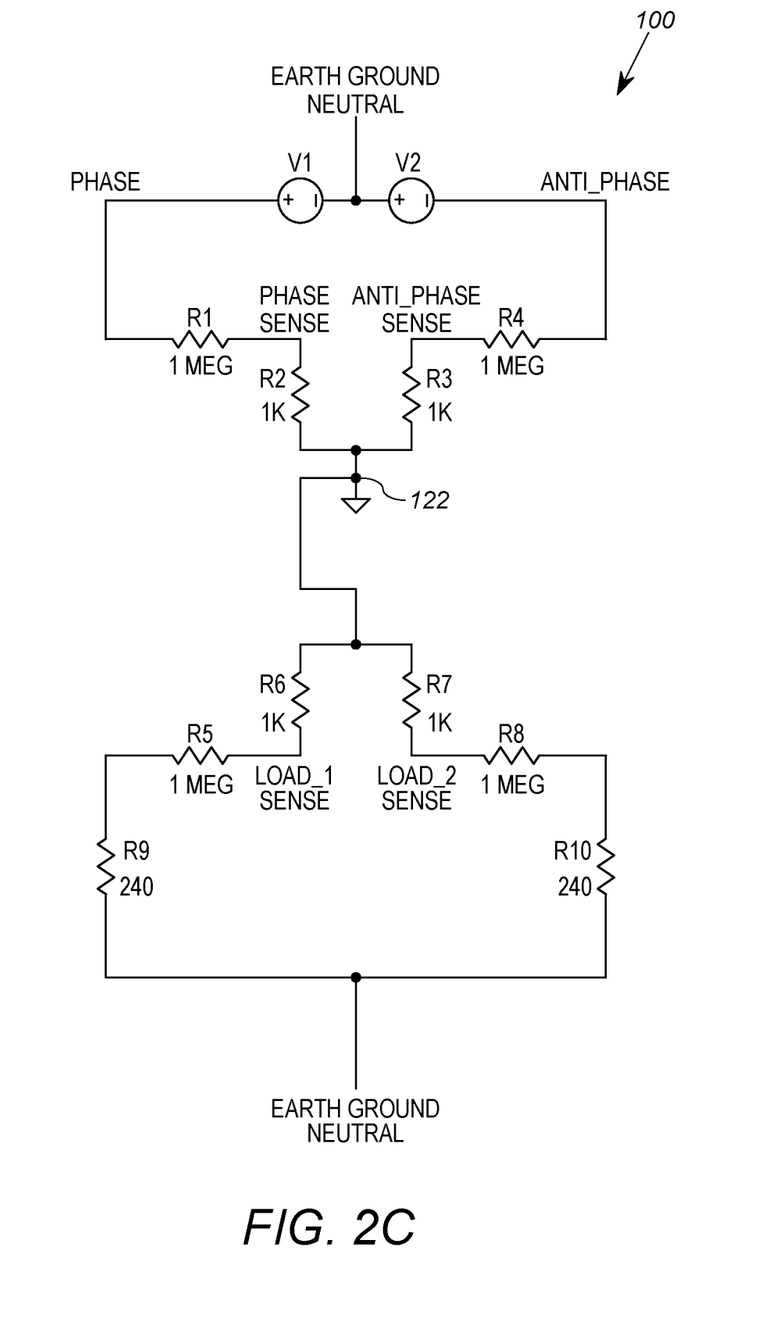
FIG. 2C shows a circuit diagram of an embodiment of the meter of FIG. 1 connected to a third load arrangement.

FIG. 2C shows a load arrangement wherein both branches of the service are loaded (i.e., both A phase and C phase, as represented by resistors R9 and R10 in FIG. 2C). No generator or other tamper arrangement is provided at the service. In this arrangement, with no voltage present on the load side of the meter 110, no load voltage is detected by the measurement and control circuit 140 (e.g., at "LOAD_SENSE1" and "LOAD_SENSE2"). The service side of the meter 110 detects a service voltage at the "Va" and/or "Vc" inputs. Based on this arrangement, the utility may close the service disconnect. In particular, because no load voltage is detected by the measurement and control circuit 140 (e.g., at "LOAD_SENSE1" and "LOAD_SENSE2") in this load arrangement, and because the circuit arrangement with floating ground reference (e.g., the arrangement of FIG. 1) prevents the detection of any phantom voltage, the utility can be confident that there is no load voltage present and determine that it is therefore safe to close the service disconnect switch.

Figure 2D:
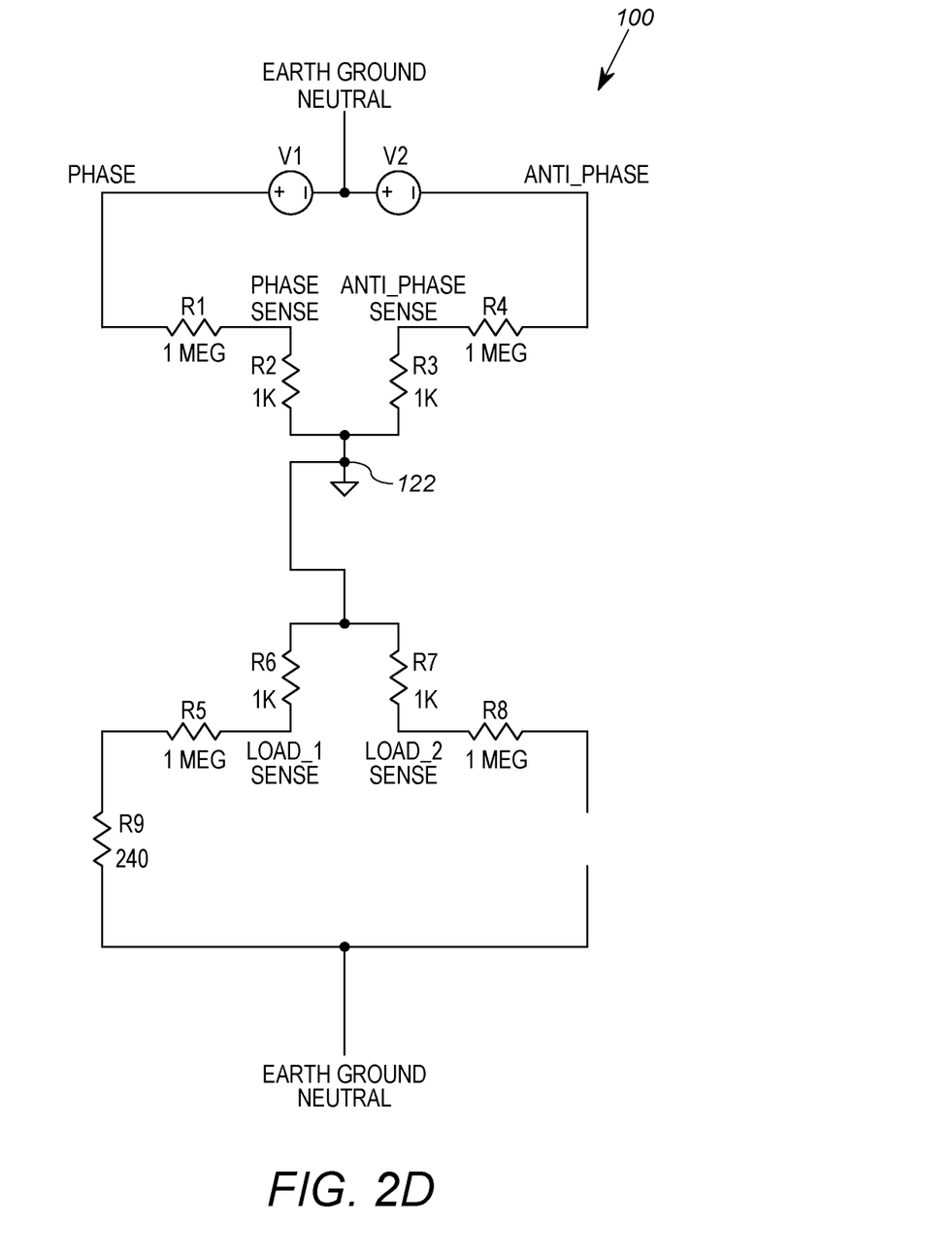
FIG. 2D shows a circuit diagram of an embodiment of the meter of FIG. 1 connected to a fourth load arrangement.

FIG. 2D shows a load arrangement wherein only one branch of the service is loaded (e.g., the A phase, as represented by resistor R9 in FIG. 2D). No generator or other tamper arrangement is provided at the service. In this arrangement, with no voltage present on the load side of the meter 110, no load voltage is detected by the measurement and control circuit 140 (e.g., at "LOAD_SENSE1" and "LOAD_SENSE2"). The service side of the meter 110 detects a service voltage at the "Va" and/or "Vc" inputs. Based on this arrangement, the utility may close the service disconnect switch. In particular, because no load voltage is detected by the measurement and control circuit 140 (e.g., at "LOAD_SENSE1" and "LOAD_SENSE2") in this load arrangement, and because the circuit arrangement with floating ground reference (e.g., the arrangement of FIG. 1) prevents the detection of any phantom voltage, the utility can be confident that there is no load voltage present and determine that it is therefore safe to close the service disconnect switch.

Figure 2E:
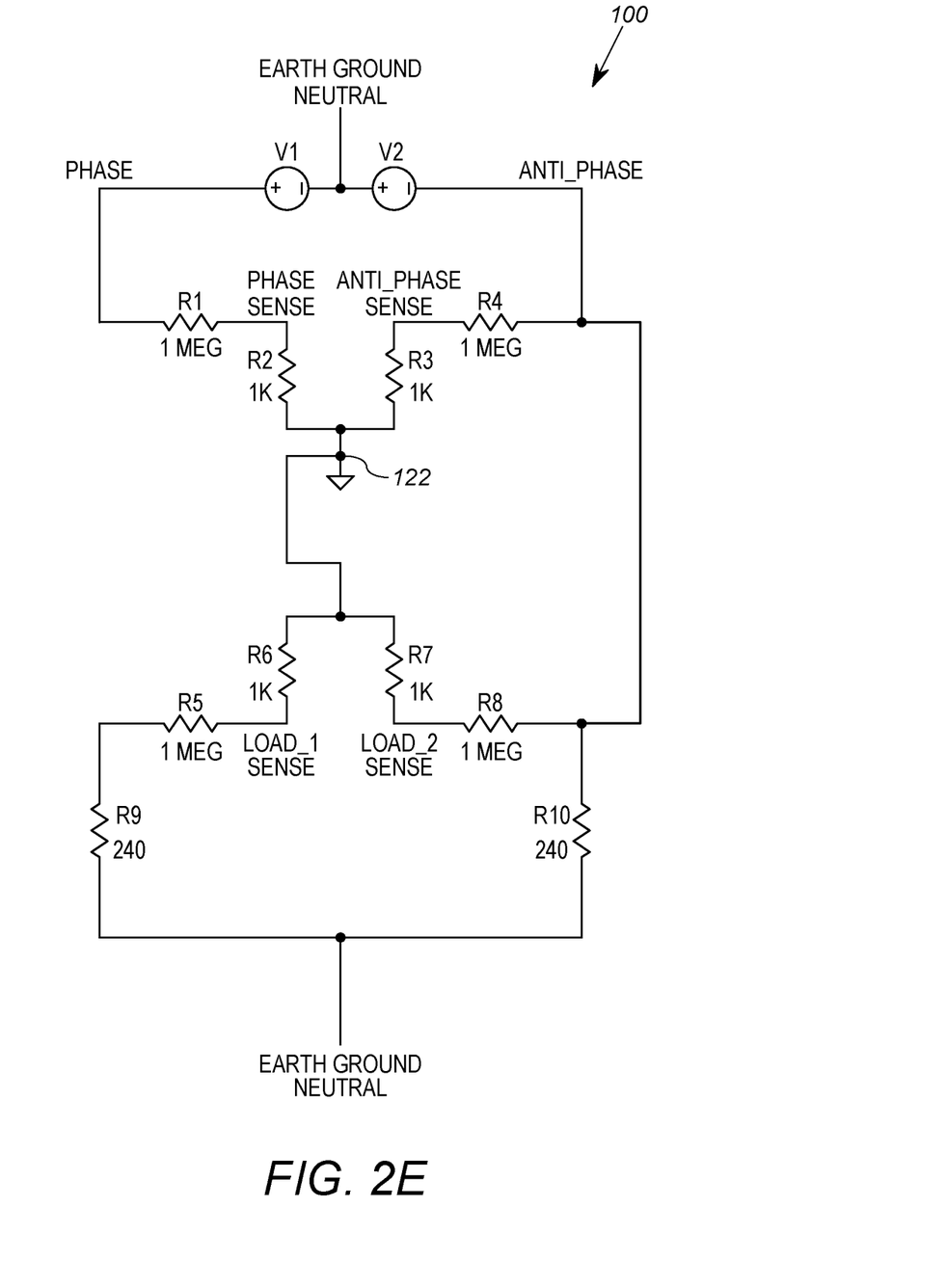
FIG. 2E shows a circuit diagram of an embodiment of the meter of FIG. 1 connected to a fifth load arrangement.

FIG. 2E shows a load arrangement wherein both branches of the service are loaded (i.e., the A phase and the C phase, as represented by resistors R9 and R10), and the C phase disconnect switch is bypassed (this also models a phase and frequency locked generator on the C phase). In this arrangement, the load side voltage will be detected on the C phase load (i.e., at the "LOAD_SENSE2" input). The imbalanced load causes a voltage to be detected on the A phase load (i.e., at the "LOAD_SENSE1" input). The load side voltage is phase and frequency locked to the line voltage. The unbalanced load still causes the reference to shift. In this case, the measured line voltage may be recovered using the following sample-by-sample computations (1) Difference/2; and (2) Sum*2. With this load arrangement, the utility can determine that a borrowed power or other tamper situation is present, and the utility can take appropriate action to resolve the issue prior to closing the service disconnect switch.

Figure 2F:
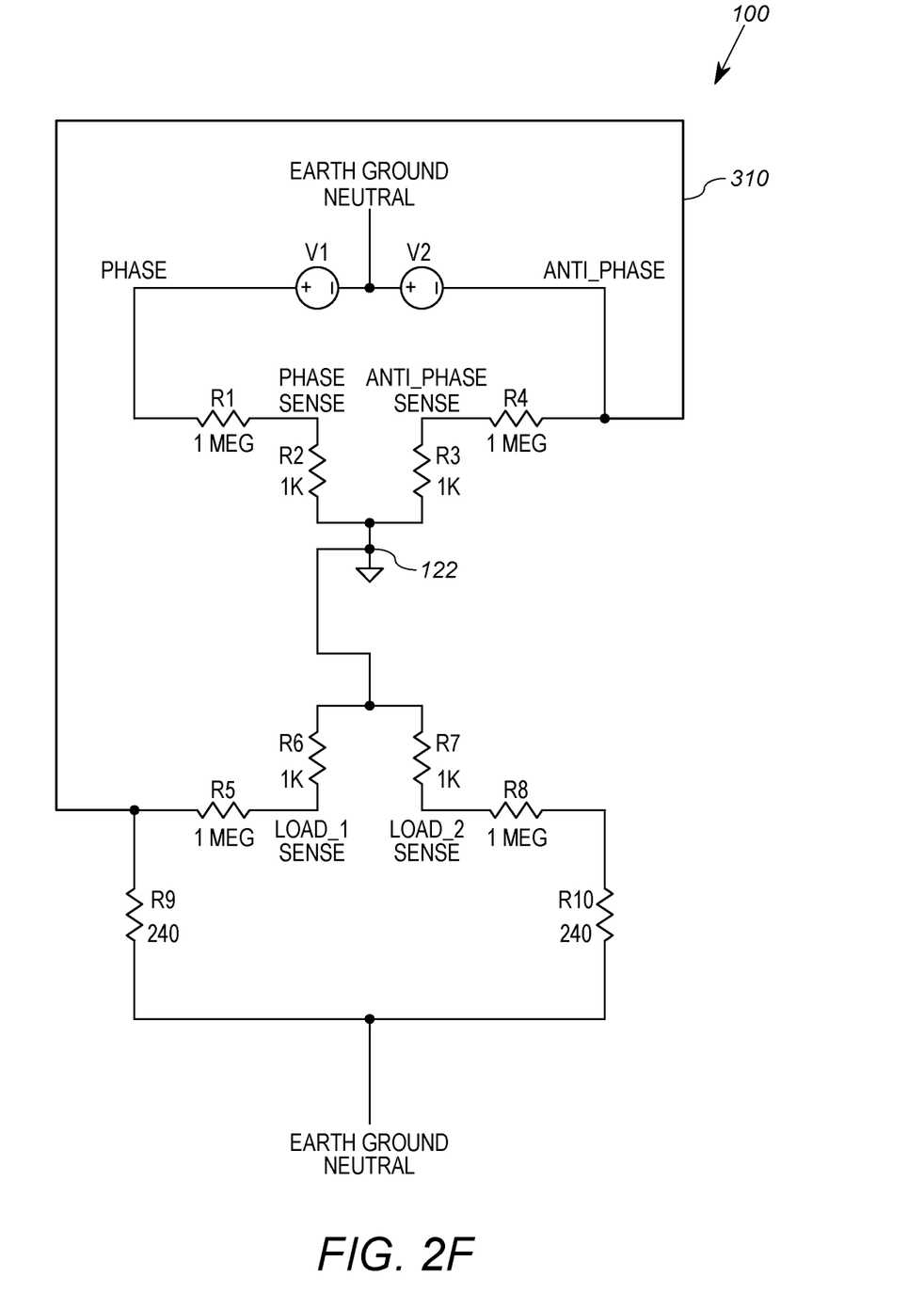
FIG. 2F shows a circuit diagram of an embodiment of the meter of FIG. 1 connected to a sixth load arrangement.

FIG. 2F shows a load arrangement wherein both branches of the service are loaded (i.e., both A phase and C phase, as represented by resistors R9 and R10 in FIG. 2A), and a customer has borrowed power from another customer in a cross-phase connection (represented by link 310). For example, a customer may have borrowed power from a neighbor using an extension cord that is run from a neighbor's residence that has service to the customer's own residence where the service disconnect switch remains open. Using the meter of FIG. 1, the utility is able to determine that this borrowed or stolen power arrangement exists. In particular, the utility will see the following readings on the measurement and control circuit 140: (1) a load-side voltage is detected on the phase A branch at the "LOAD_SENSE1" input; (2) the imbalanced load causes a voltage on the "LOAD_SENSE2" input; (3) the load side voltage is phase and frequency locked to the line voltage. The unbalanced load still causes the reference to shift. In this case, the measured line voltage may be recovered using the following sample-by-sample computations (1) Difference/2; and (2) Sum*2. Accordingly, a utility can differentiate this arrangement is likely stolen or borrowed power arrangement because it is different from a-co-generation arrangement in the following manner: (1) the Frequency spectrum of the Load 1 sense and the Anti-phase Line would be identical; and (2) a detectable beat-frequency is created between a Cogen system in the line. Based on this arrangement, the utility will not close the service disconnect switch 150 until the stolen or borrowed power arrangement is resolved. The utility may contact the customer in this situation with a notification that a stolen or borrowed power arrangement exists and must be resolved.

Figure 2G:
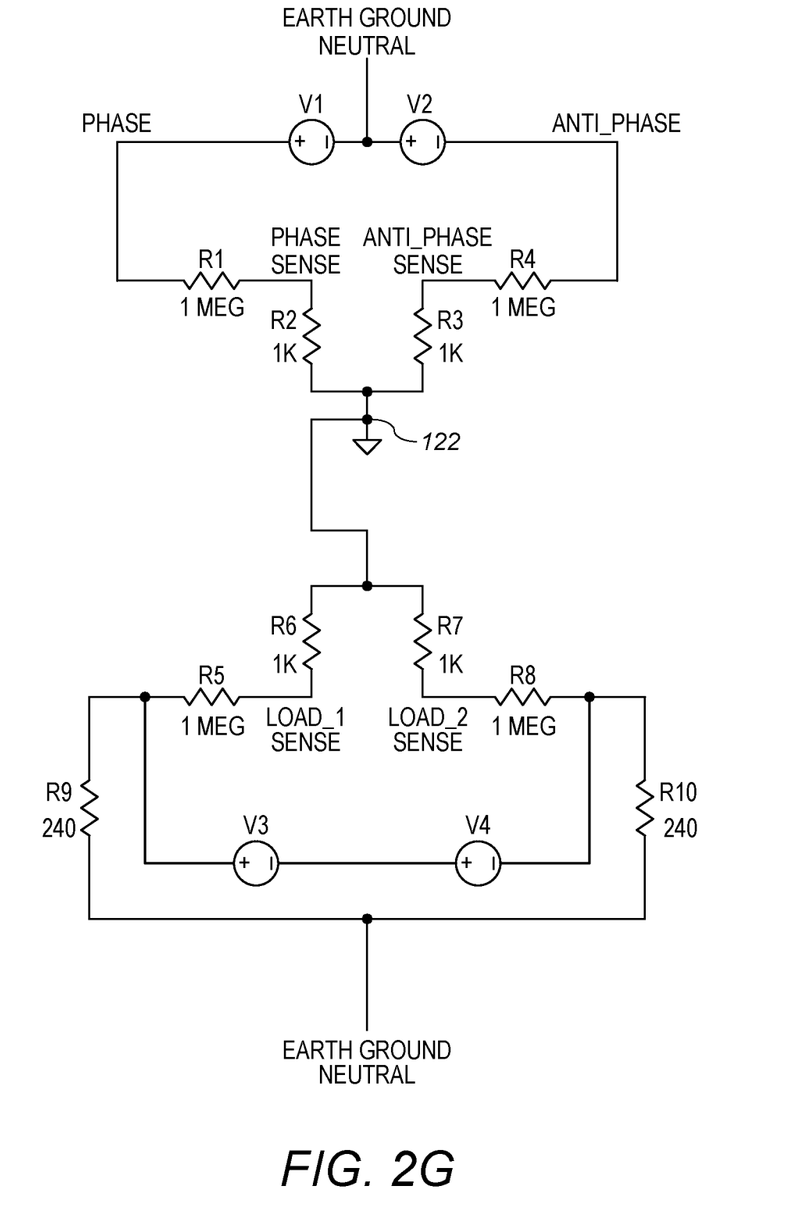
FIG. 2G shows a circuit diagram of an embodiment of the meter of FIG. 1 connected to a seventh load arrangement.

FIG. 2G shows a load arrangement wherein both branch circuits are loaded (i.e., the A phase and the C phase are both loaded), and a customer generator is connected at the service in a line-to-line arrangement (as represented by voltage source V3 and V4 in FIG. 2G). In this arrangement, the customer generator is a phase-locked loop (PLL) generator connected line-to-line, and the load has no neutral connection (i.e., is floating). Using the meter of FIG. 1, the utility is able to determine that this arrangement exists. In particular, the utility will see the following readings on the measurement and control circuit 140: (1) a load-side voltage is detected on the phase A branch at the "LOAD_SENSE1" input; (2) a load-side voltage is detected on the phase C branch at the "LOAD_SENSE1" input; and (3) since the generator is floating, it does not impact the measured signal at the line sense input ("Va" or "Vc"). Based on this arrangement, the utility will not close the service disconnect switch 150 until the generator is removed from the load. Additionally, based on the detection of a co-generation or tamper situation, the utility is empowered to take the appropriate action to resolve the issue.

While FIGS. 2A-2G represent a few exemplary load arrangements that may be detected using the meter disclosed herein with a floating ground reference, it will be recognized that detection of other load arrangements are also possible. For example, although FIG. 2A shows that the generator connected to the A phase branch of the load, the generator may alternatively be connected to the C phase branch of the load, and the utility could detect this condition based on the readings provided by the measurement and control circuit 140. Moreover, additional load configurations not discussed herein may be detected using the meter with a floating ground reference.

Figure 3:
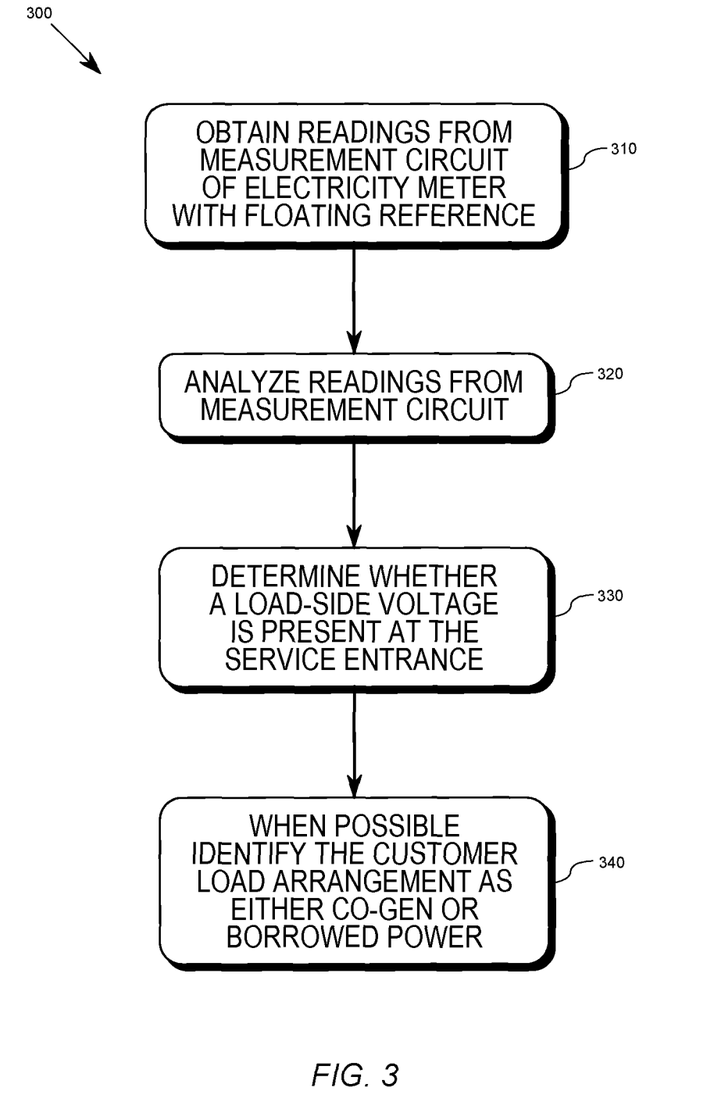
FIG. 3 is a block diagram of a method of determining a customer load arrangement using the meter of FIG. 1.

FIG. 3 shows a block diagram of a method 300 of determining a customer load arrangement. The method begins with step 310 when a technician obtains readings from the measurement and control circuit of an electricity meter. The readings may be taken from the meter either locally (e.g., by a connection on an exterior of the meter) or remotely (e.g., by wireless communication). The readings are also taken with a disconnect switch of the electricity meter opened. The readings taken from the meter particularly include readings from the line-side sense circuit 120 and the load-side sense circuit 160, both of which are connected to the floating reference node 122. As noted in step 320, after the meter readings are taken, the technician (or more precisely, computer software) analyzes the readings from the line-side sense circuit and the load-side sense circuit. Based on the analysis of the readings, any of various customer load arrangements may be determined. As noted in step 330, a determination is first made whether a load-side voltage is present at the service entrance. If no load-side voltage is present, the utility can be confident that this is the case because the arrangement of FIG. 1 eliminates phantom voltages. However, if it is determined that a load-side voltage is present, the utility may analyze the load-side voltage to identify the type of customer load arrangement. In particular, as noted in step 340, depending on the analysis of the load side voltage, the customer load arrangement may be identified as one of either a cogeneration arrangement or a borrowed power arrangement. Moreover, in certain situations, the specific type of cogeneration or borrowed power arrangement may be identified. In other situations, it may be difficult to clearly identify the specific type of arrangement (e.g., it may be difficult to differentiate between a phase lock loop co-generation arrangement and a borrowed power arrangement). In any event, when a cogeneration, borrowed power, or other tamper situation is identified, the utility make take the appropriate steps to investigate the arrangement with the confidence that the detected load-side voltage is not a phantom voltage.

Exemplary Meter with Load Sense Resistor to Eliminate Phantom Load

Figure 4:
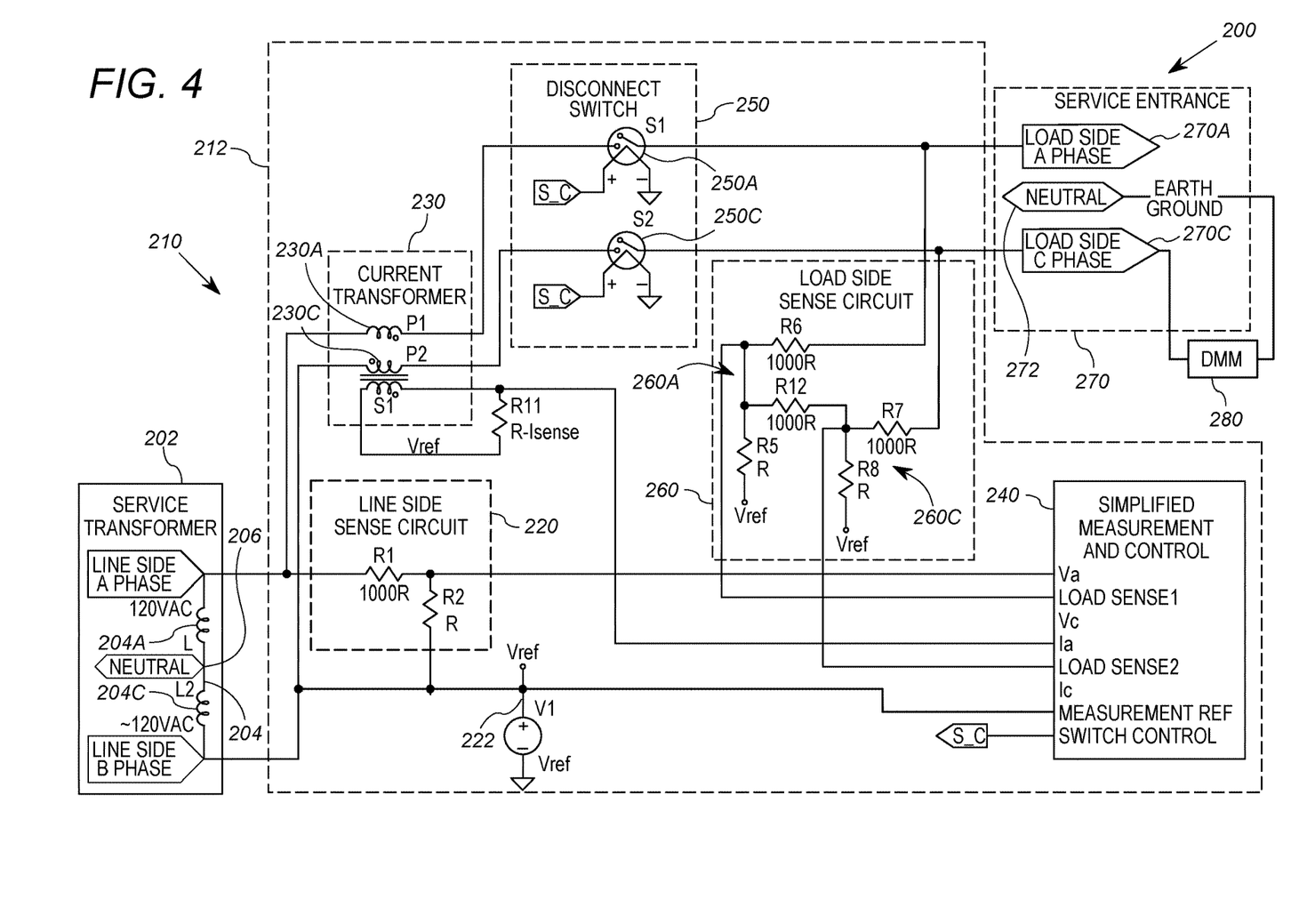
FIG. 4 shows a meter with a load-side sense circuit configured to eliminate the detection of a phantom load side voltage with the service disconnect switch open.

With reference now to FIG. 4, in at least one embodiment an exemplary split phase residential electrical service includes a service transformer 202, an electricity meter 210, and a service entrance 270. The split phase residential electrical service of FIG. 4 is identical to that described previously in association with FIG. 5, however, in the embodiment of FIG. 4, an additional resistor, R12 is positioned between the phase A resistive network 260A and a phase C resistive network 260C. In particular, the R12 resistor extends between a first node defined at the connection of resistors R5 and R6, and a second node defined at the connection of resistors R7 and R8. The resistance value of R12 is about one hundred times greater than that of R5 or R8, and about ten times less than the value of R6 and R7. Because of this resistor R12, the phantom voltage measured by the measurement and control circuit 240 is substantially eliminated (e.g., the phantom voltage may be reduced from about 115 Vrms to a mere 0.030 Vrms). In this manner, the phantom voltage that may occur in an electricity meter under certain load conditions when the service disconnect switch is opened is eliminated. As a result, a utility measuring the load voltage can be confident that a detected voltage is not a phantom voltage.

The foregoing detailed description of one or more exemplary embodiments of the method and arrangement for electrical service disconnect has been presented herein by way of example only and not limitation. It will be recognized that there are advantages to certain individual features and functions described herein that may be obtained without incorporating other features and functions described herein. Moreover, it will be recognized that various alternatives, modifications, variations, or improvements of the above-disclosed exemplary embodiments and other features and functions, or alternatives thereof, may be desirably combined into many other different embodiments, systems or applications. Presently unforeseen or unanticipated alternatives, modifications, variations, or improvements therein may be subsequently made by those skilled in the art which are also intended to be encompassed by the appended claims. Therefore, the spirit and scope of any appended claims should not be limited to the description of the exemplary embodiments contained herein.

What is claimed is:

1. An electricity meter comprising:
   a disconnect switch connected to a service transformer, the disconnect switch configured to receive a phase voltage and an anti-phase voltage from the service transformer;
   a line-side sense circuit including a first sense circuit configured to detect the phase voltage delivered to the electricity meter and a second sense circuit configured to detect the anti-phase voltage delivered to the electricity meter, the first sense circuit and the second sense circuit each connected to a floating reference node;
   a load-side sense circuit configured to detect the existence of a phase load and an anti-phase load at a service entrance; and
   a measurement and control circuit configured to receive a phase output voltage and an anti-phase output voltage from the line-side sense circuit, to receive a phase load output voltage and an anti-phase load output voltage from the load-side sense circuitry, and to control the disconnect switch to control the phase voltage and the anti-phase voltage to the service entrance.

2. The electricity meter of claim 1 where an impedance of the load-side sense circuit is significantly greater than an impedance of the line-side sense circuit.

3. The electricity meter of claim 2 wherein the impedance of the load-side sense circuit is about one hundred times greater than the impedance of the line-side sense circuit.

4. The electricity meter of claim 3 wherein the load-side sense circuit includes at least one output load resistor in a voltage divider and the line-side sense circuit includes at least one output line resister in a voltage divider, wherein the resistance of the output load resistor is about a thousand times greater than the resistance of the output line resistor.

5. The electricity meter of claim 1 wherein the load-side sense circuit includes a phase resistive network and an anti-phase resistive network, the phase resistive network including a first resistor and a second resistor with a first output between the first resistor and the second resistor, the second resistor connected to the floating reference node, the anti-phase resistive network including a third resistor and a fourth resistor with a second output between the third resistor and the fourth resistor, the fourth resistor connected to the floating reference node.

6. The electricity meter of claim 5 wherein the resistance of the first resister is much greater than the resistance of the second resistor, and wherein the resistance of the third resistor is much greater than the resistance of the fourth resistor.

7. The electricity meter of claim 6 wherein the resistance of the first resistor is about ten thousand times greater than the resistance of the second resistor, and the resistance of the third resistor is about ten thousand times greater than the resistance of the fourth resistor.

8. An electricity meter comprising:
   a disconnect switch connected to a service transformer, the disconnect switch configured to receive a voltage delivered to the electricity meter from a service transformer;
   a line-side sense circuit connected to a floating reference node, the line-side sense circuit configured to detect the voltage delivered to the electricity meter and to provide an output;

a load-side sense circuit configured to detect the existence of a load at a service entrance and to provide an output; and a control circuit configured to receive the output from the line-side sense circuit and the output from the load-side sense circuit, to deliver an output signal to the floating reference node for controlling the floating reference node, and to control the disconnect switch to control the voltage to the load at the service entrance based on the output from the line-side sense circuit and the output from the load-side sense circuit.

9. The electricity meter of claim 8 wherein the control circuit is a measurement and control circuit.

10. The electricity meter of claim 8 wherein the load-side sense circuit includes a resistive network, the line-side sense circuit includes a resistive network, and an impedance of the load-side sense circuit is significantly greater than an impedance of the line-side sense circuit.

11. The electricity meter of claim 10 wherein the impedance of the load-side sense circuit is at least one hundred times greater than the impedance of the line-side sense circuit.

12. The electricity meter of claim 11 wherein an output impedance of an output resistor of resistive network of the load-side sense circuit is about one thousand times greater than an output impedance of an output resistor of the resistive network of the line-side sense circuit.

13. The electricity meter of claim 11 wherein the line-side sense circuit includes a phase sense circuit and an anti-phase sense circuit, and wherein the phase sense circuit and the anti-phase sense circuit are both connected to the floating reference node.

14. The electricity meter of claim 11 wherein the service transformer includes a service neutral and wherein the floating reference node is configured to approximate a voltage value of the service neutral.

15. The electricity meter of claim 14 wherein the service transformer and the service neutral provide a split-phase electrical service for the electricity meter.

16. A method of detecting a customer load arrangement comprising:

obtaining readings from a measurement circuit of an electricity meter with a disconnect switch of the electricity meter opened, the electricity meter including a line-side sense circuit connected to a floating reference node and a load-side sense circuit connected to the floating reference node;

analyzing the readings from the line-side sense circuit to detect a line-side voltage and analyzing the readings from the load-side sense circuit to detect a load-side voltage;

determining whether the customer load arrangement is one of a cogeneration arrangement or borrowed power arrangement using the line-side voltage and the load-side voltage, wherein when there is a frequency difference between the load-side voltage and the line-side voltage determining that the customer load arrangement is the cogeneration arrangement and when there is a frequency lock between the load-side voltage and the line-side voltage determining that the customer load arrangement is the borrowed power arrangement.

17. The method of claim 16 wherein the line-side sense circuit includes a first sense circuit configured to detect a phase voltage delivered to the electricity meter and a second sense circuit configured to detect an anti-phase voltage delivered to the electricity meter, and wherein the load-side sense circuit is configured to detect the existence of a phase load and an anti-phase load at a service entrance.

18. The method of claim 17 wherein an impedance of the load-side sense circuit is significantly greater than an impedance of the line-side sense circuit.

* * * * *